United States Patent
Kerr et al.

(10) Patent No.: US 6,692,605 B2
(45) Date of Patent: Feb. 17, 2004

(54) METHOD FOR LAMINATING AN OVERLAY TO VERIFY A PATTERN OR AS A PATTERN

(75) Inventors: Roger S. Kerr, Brockport, NY (US); William L. DeMarco, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 289 days.

(21) Appl. No.: 09/977,548

(22) Filed: Oct. 15, 2001

(65) Prior Publication Data
US 2003/0070749 A1 Apr. 17, 2003

(51) Int. Cl.[7] .......................... B44C 1/16; B32B 31/20; B41M 3/00; B44B 5/02; B41B 1/14
(52) U.S. Cl. .................. 156/230; 156/239; 156/240; 156/247; 156/277; 156/289; 427/148; 428/202; 428/914; 101/28; 101/34; 101/400
(58) Field of Search ................. 156/230, 231, 156/233, 234, 235, 239, 240, 241, 247, 277, 289; 427/146, 147, 148, 162; 428/195, 200, 202, 343, 347, 914; 101/9, 28, 36, 360, 395, 400, 407.1, 33, 34; 400/118.2; 347/101, 103, 105; 503/227

(56) References Cited

U.S. PATENT DOCUMENTS

| 4,329,420 A | * | 5/1982 | Bopp | 430/293 |
|---|---|---|---|---|
| 5,203,942 A | | 4/1993 | DeCook et al. | |
| 5,240,810 A | * | 8/1993 | Barjesteh | 430/257 |
| 5,268,708 A | | 12/1993 | Harshbarger et al. | |
| 5,478,434 A | | 12/1995 | Kerr et al. | |
| 6,508,527 B1 | * | 1/2003 | Kerr | 156/277 |
| 6,554,941 B2 | * | 4/2003 | Kerr | 156/230 |
| 6,572,720 B2 | * | 6/2003 | Kerr | 156/182 |

FOREIGN PATENT DOCUMENTS

| EP | 413863 | * | 2/1991 | G03F/3/10 |

* cited by examiner

Primary Examiner—J. A. Lorengo
(74) Attorney, Agent, or Firm—Buskop Law Group, P.C.

(57) ABSTRACT

A method for forming an overlay (310); to be used to verify or form a folding die (300), embossing die (330), or rule die (320) comprising the steps of; creating an imaged receiver sheet (140) having an image (210), a first thermal print layer (224), and a support layer, laminating an imageless receiver sheet (160) having a second thermal print layer (228) and a second support layer (170), which is preferably clear with the imaged receiver sheet (140), thereby encapsulating the image (210) between the first thermal print layer (224) and the second thermal print layer (228); removing the first support layer (150); removing the second support layer (170); forming an overlay (310) having an electrostatic charge; to be used to verify or form a folding die (300), embossing die (330), or rule die (320).

15 Claims, 5 Drawing Sheets

METHOD FOR LAMINATING AN OVERLAY TO VERIFY A PATTERN OR AS A PATTERN

CROSS REFERENCE TO RELATED APPLICATIONS

Reference is made to commonly-assigned copending U.S. patent application Ser. No. 09/911,785, filed Jul. 24, 2001, entitled A SELF-ADHERING IMAGE, by Roger S. Kerr, the disclosure of which is incorporated herein.

FIELD OF THE INVENTION

The present invention relates to preparing overlay's to be used to verify a pattern or as a pattern in the manufacturing process of folding, embossing or rule dies, using a lamination method that uses pressure or heat and pressure to laminate media together.

BACKGROUND OF THE INVENTION

Pre-press proofing is a procedure that is used primarily by the printing industry for creating representative images of printed material. In the printing industry, pre-press proofs are used to check for color balance, control parameters, and other important image quality requirements, without the cost and time that is required to actually produce printing plates, set up a printing press, and produce an example of an representative image, which results in higher costs and loss of profits that would ultimately be passed on to the customer. Once the pre-press proofing process is complete. Product is printed and sometimes converted to packaging for various items requiring folding, embossing or rule dies.

To create a pre-press proof, first, an original image is separated into individual color separations or digital files. The original image is scanned or separated into the three subtractive primaries and black. Typically, a color scanner is used to create the color separations or digital files and in some instances, more than four color separations or digital files are used. Although there are several ways used in the printing industry to create a pre-press proof from color separations or digital files, they are generally of three types. The first method being a color overlay system that employs the representative image on a separate base for each color, the image is then overlaid on each other to create a pre-press proof. The second method uses a single integral sheet process in which the separate colors for the representative image are transferred one at a time by lamination onto a single base. The third is a digital method in which the representative image is produced directly onto a receiver stock, from digital files.

The representative image to be laminated can be, but is not limited to being created on a commercially available Kodak image processing apparatus, depicted in commonly assigned U.S. Pat. No. 5,268,708 which describes an image processing apparatus having half-tone color imaging capabilities. The above-mentioned image processing apparatus is arranged to form a representative image onto a sheet of thermal print media. In this process, dye from a sheet of dye donor material is transferred to the thermal print media by applying a sufficient amount of thermal energy to the dye donor sheet material to form the intended image. The image processing apparatus is comprised generally of a material supply assembly consisting of a lathe bed scanning subsystem. The scanning subsystem includes: a lathe bed scanning frame, translation drive, translation stage member, printhead, imaging drum, and media exit transports.

The operation of the image processing apparatus comprises: metering a length of the thermal print media (in roll form) from the material supply assembly. The thermal print media is then measured and cut into sheet form of the required length and transported to the imaging drum, registered, wrapped around, and secured onto the imaging drum. Next, a length of dye donor material (in roll form) is also metered out of the material supply assembly, then measured and cut into sheet form of the required length. It is then transported to the imaging drum and wrapped around the imaging drum utilizing a load roller which is described in detail in commonly assigned U.S. Pat. No. 5,268,708. By wrapping, it is superposed in the desired registration with respect to the thermal print media (which has already been secured to the imaging drum).

After the dye donor sheet material is secured to the periphery of the imaging drum, the scanning subsystem or write engine provides the imaging function. This imaging function is accomplished by retaining the thermal print media and the dye donor sheet material on the imaging drum while it is rotated past the printhead. The translation drive traverses the printhead and translation stage member axially along the axis of the imaging drum, in coordinated motion with the rotating imaging drum. These movements combine to produce the intended image on the thermal print media.

Once a representative image has been formed on the thermal print media, the dye donor sheet material is then removed from the imaging drum. This is accomplished without disturbing the thermal print media that is beneath it. The dye donor sheet material is then transported out of the image processing apparatus by means of the material exit transport. Additional dye donor sheet materials are sequentially superimposed with the thermal print media on the imaging drum. These materials are then imaged onto the thermal print media previously mentioned until the representative image is completed and transferred onto the thermal print media. The completed representative image formed thereon is then unloaded from the imaging drum and transported by the receiver sheet material exit transport to an exit tray in the exterior of the image processing apparatus.

After a representative image has been formed on the thermal print media as previously described, it is then transferred to a receiver stock such that the pre-press proof is representative of an image that would be printed on a printing press. A Kodak Laminator as described in U.S. Pat. No. 5,478,434 can be used to bond or laminate the representative image as part of a pre-press color proofing system but this invention is not limited to the use of this device. U.S. Pat. No. 5,203,942 describes a Kodak Laminator that employs a lamination/de-lamination system as applied to a drum laminator, and pending U.S. patent application Ser. No. 09/676,877 describes a Kodak Laminator that employs endless belts incorporated into the lamination apparatus. For the purpose of this patent application the laminator described in pending U.S. patent application Ser. No. 09/676,877 will be used. It should be noted that the present invention described in this disclosure is not limited to a Kodak Laminator or to the type of laminator reference above.

Generally laminating a pre-press proof comprises a two pass, lamination process. For the first step, a sheet of pre-laminate, which has a pre-laminate support layer and a thermal print layer, encapsulation or protective layer, is placed on top of a receiver sheet, which is also called "receiver stock" in the industry. This construction of multiple layers is a lamination sandwich, which is fed into the laminator. Once the lamination sandwich exits the laminator the pre-laminate support layer is peeled away from the now pre-laminated receiver stock.

For the second pass, the imaged thermal print media with the representative image formed thereon is placed on the pre-laminated receiver stock with representative image face down on the pre-laminated receiver stock and fed into the laminator. After the lamination sandwich has exited the laminator, the thermal print support layer is peeled away, leaving the completed pre-press proof simulating an image produced on a printing press.

While the above-described lamination method works well for both laser thermal and inkjet pre-press proofs, there exists a need for an overlay to be used as a pattern or to verify a pattern in the manufacturing process of folding, embossing or rule dies used in the packaging industry to convert printed material into packaging of different shapes and sizes for a variety of products.

SUMMARY OF THE INVENTION

The present invention provides a method of forming an overlay to be used as a pattern or to verify a pattern in the manufacturing process of folding, embossing or rule dies. The novel methods of the present invention are preferably for forming an overlay to be used as a pattern or to verify a pattern in the manufacturing process of folding, embossing or rule dies, but not limited to with an image resolution of between about 1000 and 4000 dpi and most preferably having a resolution of about 1800 to 3000 dpi. The overlay can be a monochrome image or multicolor image. The image receiver sheet support layers can comprise a release layer, an aluminized layer, and a support base or combination thereof, or just a support base. The base can be made from polyester, polyethylene, or other materials well known in the art. The thermal print layers have a thickness ranging from 1 micron to 75 microns, and more preferably from 1 to 25 microns.

The invention relates to a method for forming an overlay to be used as a pattern or to verify a pattern in the manufacturing process of folding, embossing or rule dies comprising the steps of: creating an imaged receiver sheet having an image, a first thermal print layer, and a support layer; laminating an imageless receiver sheet having a second thermal print layer and a second support layer, which is preferably clear with the imaged receiver sheet, thereby encapsulating the image between the first thermal print layer and the second thermal print layer; removing the first support layer forming an overlay; using said overlay having an image, preferably using an electrostatic charge; to aid in the manufacture of folding, embossing or rule dies.

The invention also relates to a method for forming an overlay to be used as a pattern or to verify a pattern in the manufacturing process of folding, embossing or rule dies comprising the steps of: creating an imaged receiver sheet having an image, a first thermal print layer, and a support layer; laminating an imageless receiver sheet having a second thermal print layer and a second support layer, with the imaged receiver sheet, thereby encapsulating the image between the first thermal print layer and the second thermal print layer; removing the first support layer; removing the second support layer forming an overlay; using said overlay having an image, preferably using an electrostatic charge; to aid in the manufacture of folding, embossing or rule dies.

The invention also relates to a method for forming an overlay to be used as a pattern or to verify a pattern in the manufacturing process of folding, embossing or rule dies comprising the steps of: creating an imaged receiver sheet having an image, a first thermal print layer, and a support layer; laminating a plastic sheet, which is preferably clear with the imaged receiver sheet, thereby encapsulating the image between the first thermal print layer and the second thermal print layer; removing the first support layer forming an overlay; using said overlay having an image, preferably using an electrostatic charge; to aid in the manufacture of folding, embossing or rule dies.

The invention, its objects and advantages, will become more apparent in the detailed description of the preferred embodiments presented below.

DETAILED DESCRIPTION OF THE INVENTION

The present description will be directed, in particular, to elements forming part of, or cooperating more directly with, an apparatus in accordance with the present invention. It is to be understood that elements not specifically shown or described may take various forms well know to those skilled in the art. For the sake of discussion, but not limitation, the preferred embodiment of the present invention will be illustrated in relation to a laminating apparatus for making pre-press proofs.

Figure 1:
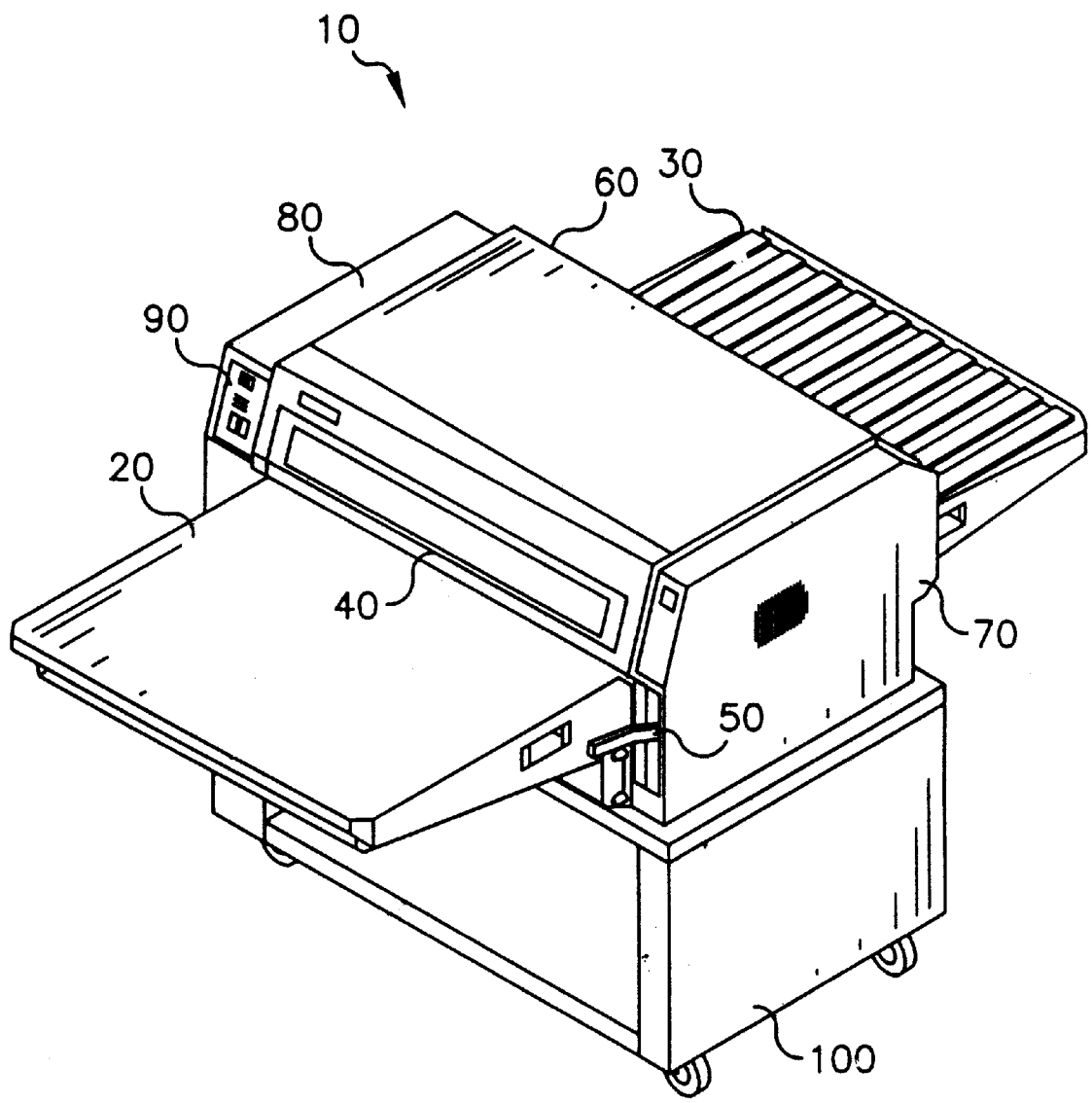
FIG. 1 is a perspective view showing a laminator known in the related art used with the present invention.

Referring to the drawings wherein like reference numerals represent identical or corresponding parts throughout the several views. Referring to FIG. 1, there is shown a perspective view of laminator 10 as described in U.S. patent application Ser. No. 09/676,877. The laminator has an: entrance table 20, exit table 30, entrance slot 40, pressure lever 50, top cover 60, right side cover 70, left side cover 80, control panel 90, and lamination base 100.

Figure 2:
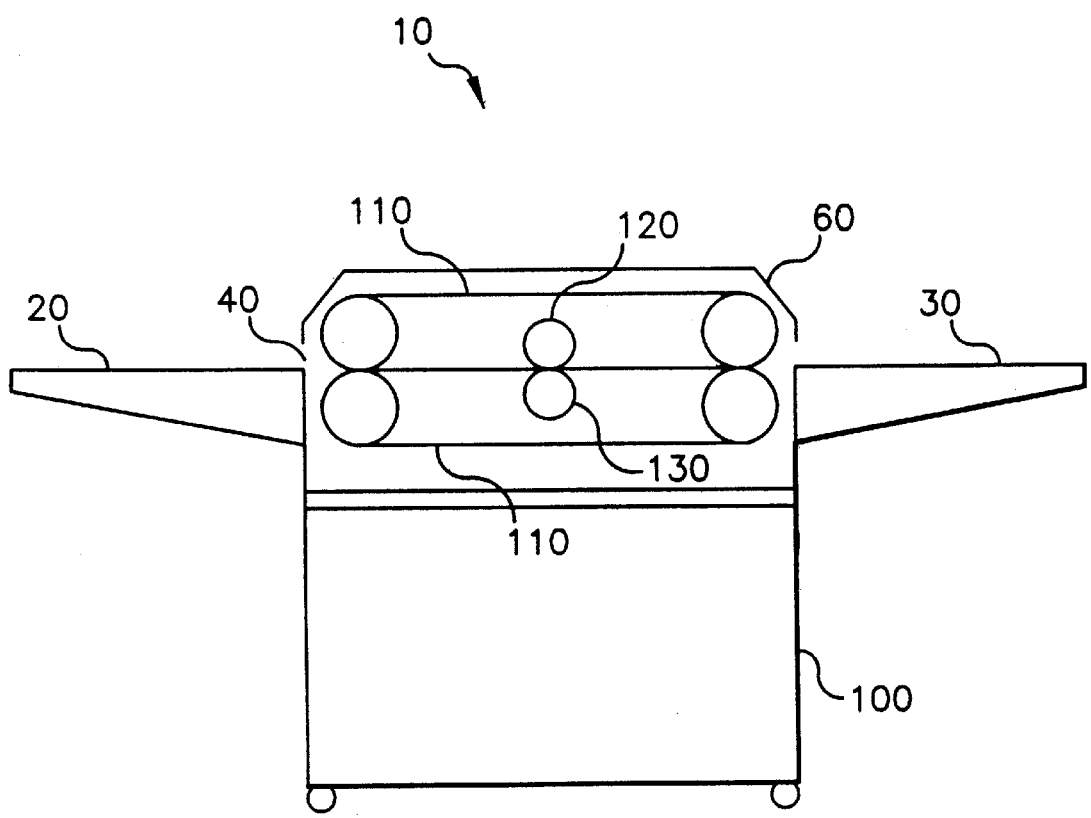
FIG. 2 is a schematic right side elevation of the laminator known in the related art of FIG. 1.

FIG. 2 is a schematic right side elevation of the laminator of FIG. 1 showing endless belts 110 with upper lamination roller 120 and lower lamination roller 130 which convey media to be laminated through the laminator 10. Media to be bonded or laminated pass between the endless belts 110. Upper lamination roller 120 and lower lamination roller 130 provide heat and pressure to laminate the desired media together. This configuration with upper lamination roller 120 and lower lamination roller 130 is known in the art as a "straight-through" lamination. Although the illustrated embodiments show both the upper lamination roller 120 and lower lamination roller 130 as heated rollers, it also should be recognized and only upper lamination roller 120 or lower lamination roller 130 may be heated. It is further recognized that both upper lamination roller 120 and lower lamination roller 130 do not have to be heated for cold lamination applications to work within the scope of this invention.

Figure 3:
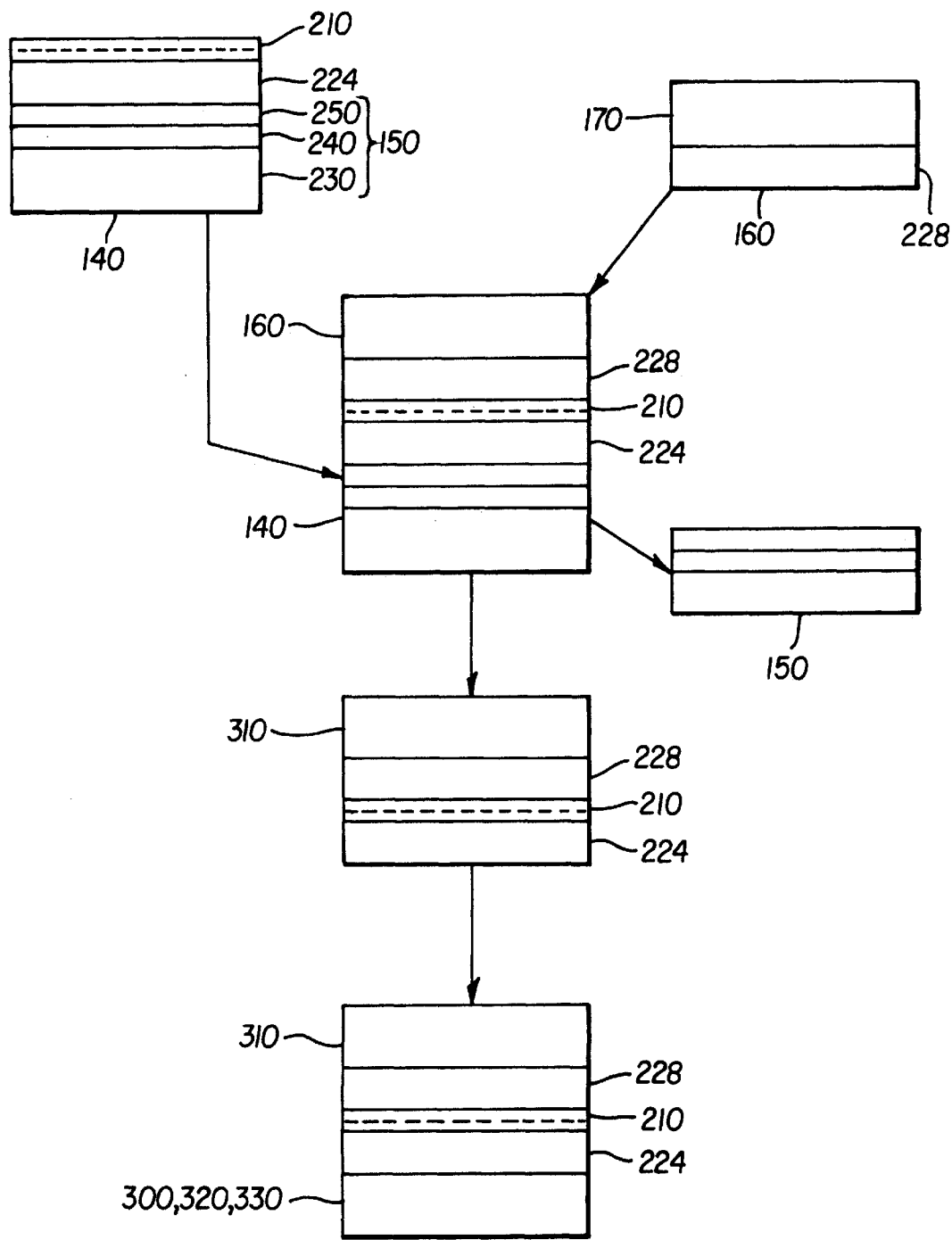
FIG. 3 is a block diagram of the present invention showing an embodiment of a method for forming an overlay to be used as a pattern or to verify a pattern in the manufacturing process of folding, embossing or rule dies.

FIG. 3 is a block diagram outlining a method for forming an overlay 310 preferably having a surface energy charge, to be used as a pattern or to verify a folding die 300, embossing die 330 or a rule die 320, wherein said overlay 310 is formed by the method comprising the steps of: creating an imaged receiver sheet 140 comprising an image 210, a first thermal print layer 224, and a first support layer 150 having; a support base 230, an aluminized layer 240, and a release layer 250 it should be noted that first support layer 150 may be comprised of several layers or a single support base 310. Laminating said imaged receiver sheet 140 to an imageless receiver sheet 160 having a second thermal print layer 228, and a second support layer 170, which is preferably clear, thereby encapsulating the image 210 between the first thermal print layer 224 and the second thermal print layer 228; removing the first support layer 150, resulting in an overlay 310, to be used as a pattern or to verify a folding die 300, embossing die 330 or a rule die 320.

Figure 4:
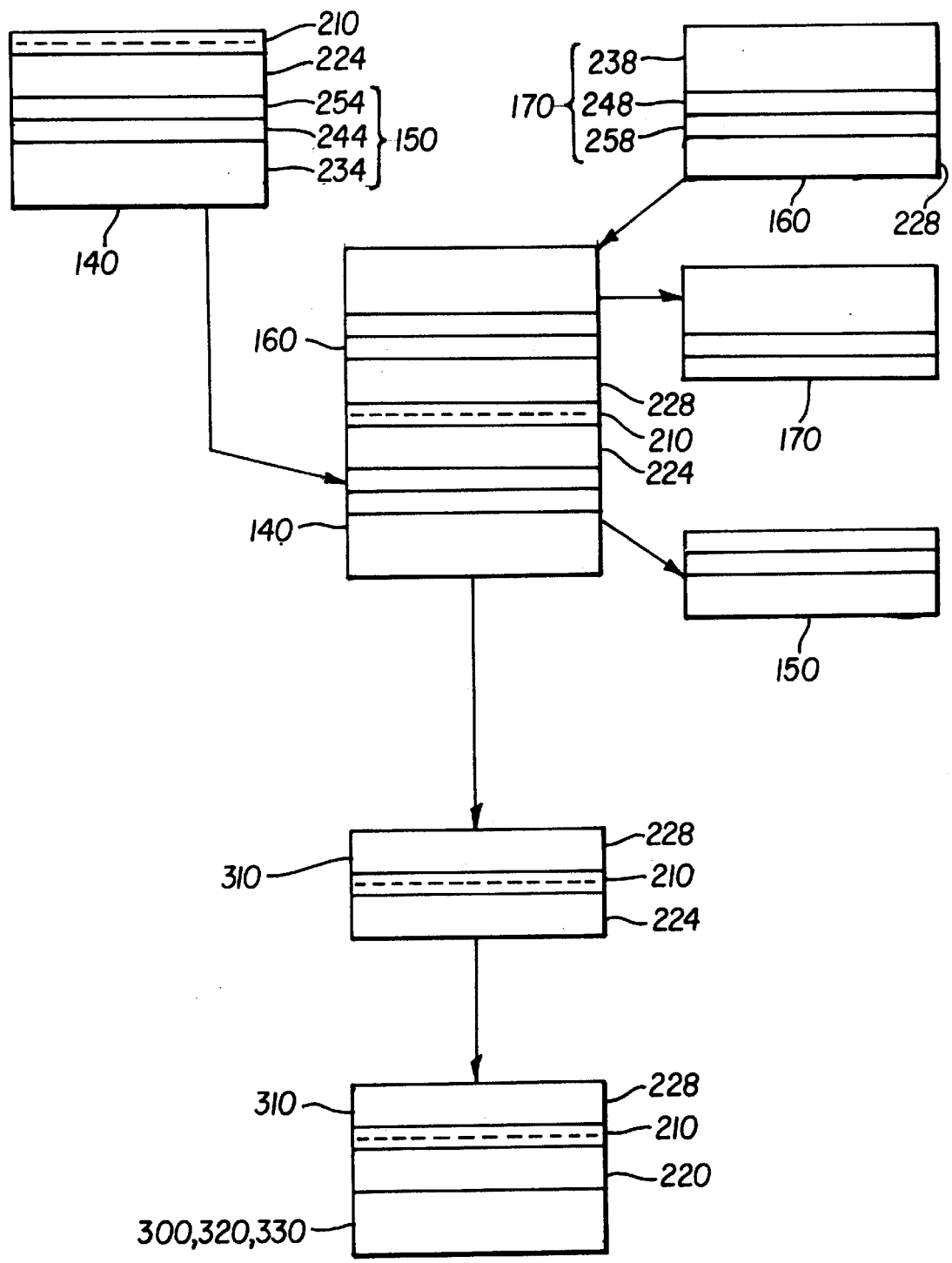
FIG. 4 is a block diagram of the present invention showing a another embodiment of a method for forming an overlay to be used as a pattern or to verify a pattern in the manufacturing process of folding, embossing or rule dies.

FIG. 4 is a block diagram outlining a method for forming an overlay 310 preferably having a surface energy charge, to be used as a pattern or to verify a folding die 300, embossing die 330 or a rule die 320, wherein said overlay 310 is formed by the method comprising the steps of: creating an imaged receiver sheet 140 comprising an image 210, a first thermal print layer 224, and a first support layer 150 having; a first support base 234, a first aluminized layer 244, and a first release layer 254 it should be noted that first support layer 150 may be comprised of several layers or a single support base 310. Laminating said imaged receiver sheet 140 to an imageless receiver sheet 160 having a second thermal print layer 228, and a second support layer 170 it should be noted that second support layer 170 may be comprised of several layers or a single support base 310, having; a second support base 238, a second aluminized layer 248, and a second release layer 258 it should be noted that second support layer 170 may be comprised of several layers or a single support base 310, thereby encapsulating the image 210 between the first thermal print layer 224 and the second thermal print layer 228; removing the first support layer 150, removing the second support layer 170; resulting in an overlay 310, to be used as a pattern or to verify a folding die 300, embossing die 330 or a rule die 320.

Figure 5:
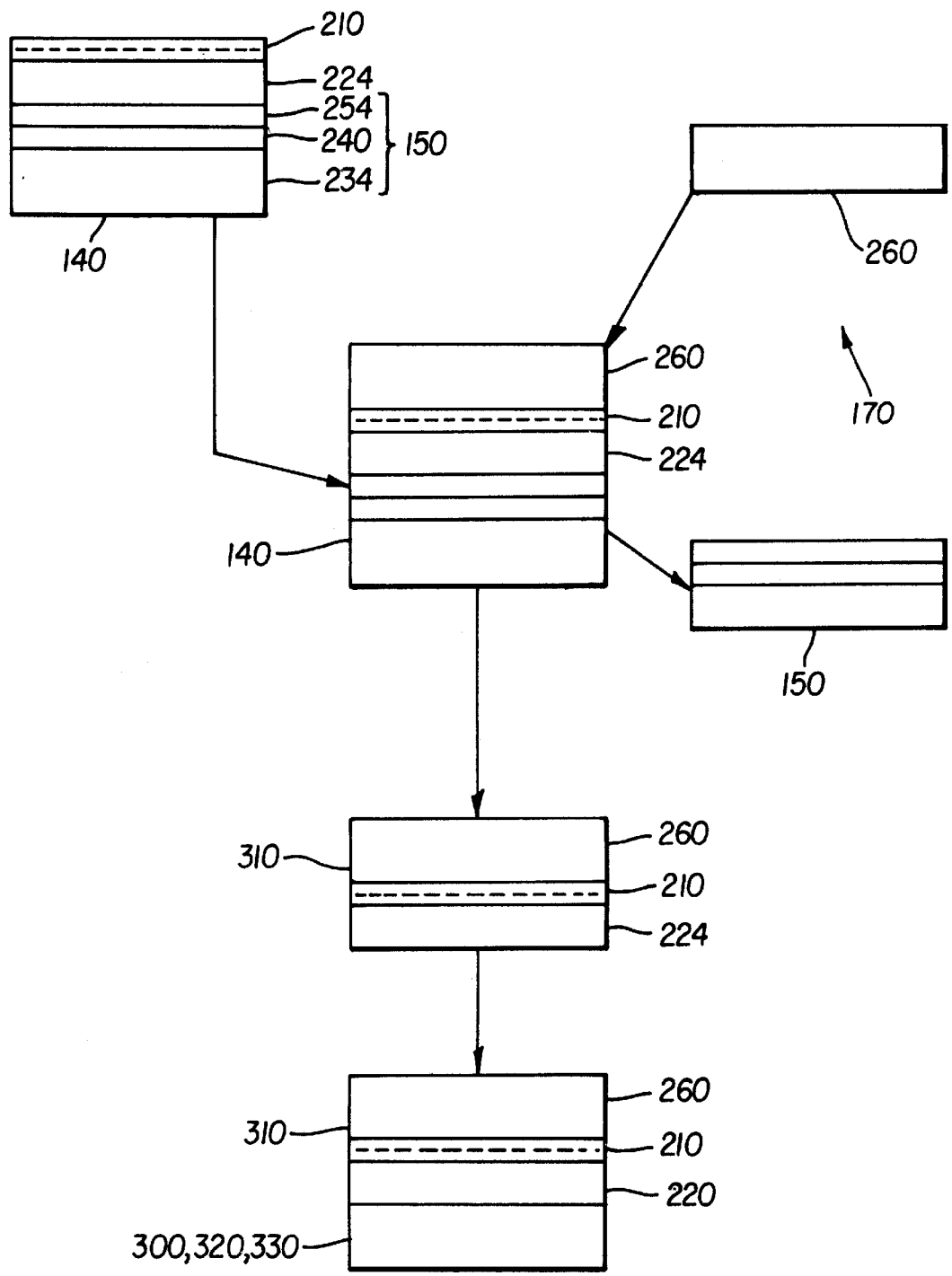
FIG. 5 is a block diagram of the present invention showing a another embodiment of a method for forming an overlay to be used as a pattern or to verify a pattern in the manufacturing process of folding, embossing or rule dies.

FIG. 5 is a block diagram outlining a method for forming an overlay 310 preferably having a surface energy charge, to be used as a pattern or to verify a folding die 300, embossing die 330 or a rule die 320, wherein said overlay 310 is formed by the method comprising the steps of: creating an imaged receiver sheet 140 comprising an image 210, a thermal print layer 220, and a support layer 145 having; a support base 230, an aluminized layer 240, and a release layer 250 it should be noted that support layer 145 may be comprised of several layers or a single support base 310. Laminating said imaged receiver sheet 140 to a plastic sheet 260 which is preferably clear, thereby encapsulating the image 210 between the thermal print layer 220 and the plastic sheet 260; removing the first support layer 150, resulting in an overlay 310, to be used as a pattern or to verify a folding die 300, embossing die 330 or a rule die 320.

The thermal print layer 220, first thermal print layer 224, and the second thermal print layer 228 of the above described methods for forming an overlay 310 preferably has a thickness ranging from 1 micron to 75 microns, and most preferably is a thickness ranging from 1 to 25 microns and are made of a Butvar material, but could be a polyacrylate material, or other materials known in the art.

The image 210 of the imaged receiver sheet 140 of the above, described methods for forming an overlay 310 preferably has a resolution of between about 1000 and about 4000 dpi, and most preferred the image receiver sheet 140 has a resolution of between about 1800 and about 3000 dpi.

In alternative embodiments, the second support layer 170 is clear.

In one embodiment, the material for the thermal print layer 220, first thermal print layer 224, and second thermal print layer 228 encapsulating the image 210 is most preferably a Butvar having the same thickness on both sides.

In alternative embodiments, the encapsulating material of the thermal print layer 220, first thermal print layer 224, and second thermal print layer 228 is contemplated as a polyacrylate, Butvar, or other material well known in the art. Whether a polyacrylate, Butvar, or other material well known in the art, the thickness of the thermal print layer 220, first thermal print layer 224, and second thermal print layer 228 can be identical or disparate to each other.

In performing the methods described above, it is considered within the scope of the invention that the lamination temperatures ranges up to about 160° C. and preferably, 130° C. for dye-based and pigment-based images. Pressures for the methods described above are around 80 psi.

In embodiments of the invention described above, image 210, can be generated by laser thermal, inkjet or combinations thereof, or other methods well known in the art.

In embodiments of the invention described above, the imaged receiver sheet 140 can have a monochrome image or multicolor image.

In alternative embodiments the first support layer 150 can comprise a support base 230, first support base 234, and second support base 238; an aluminized layer 240, first aluminized layer (not shown), and second aluminized layer (not shown); a release layer 250, first release layer 254, and second release layer 258 or combinations thereof.

The support base 230, first support base 234, and second support base 238 can be made of polyester, polyethylene, combinations of the two materials, or other materials well known in the art.

The invention has been described in detail with particular reference to certain preferred embodiments thereof, but it will be understood that variations and modifications can be effected within the scope of the invention.

Parts List

10. Laminator
20. Entrance table
30. Exit table
40. Entrance slot
50. Pressure lever
60. Top cover
70. Right side cover
80. Left side cover
90. Control panel
100. Lamination base
110. Endless belts
120. Upper lamination roller
130. Lower lamination roller
140. Imaged receiver sheet
145. Support layer
150. First support layer
160. Imageless receiver sheet
170. Second support layer
190. Protective layer
210. Image
220. Thermal print layer 224. First thermal print layer
228. Second thermal print layer
230. Support base
234. First support base
238. Second support base
240. Aluminized layer
244. First aluminized layer
248. Second aluminized layer
250. Release layer
254. First release layer
258. Second release layer
260. Plastic sheet
300. Folding Die
310. Overlay
320. Rule die
330. Embossing die

What is claimed is:

1. A method of using an overlay to verify the shape of a die, comprising the steps of:
   a) forming an overlay by the method consisting of the steps of:
      i) creating an imaged receiver sheet having an image comprising a first thermal print layer; and a first support layer;
      ii) laminating an imageless receiver sheet having a second thermal print layer and a second support layer with said imaged receiver sheet, thereby encapsulating said image;
      iii) removing said first support layer forming an overlay having an electrostatic charge; and
   b) using said overlay to verify or form a rule die.

2. The method of claim 1 wherein said first support layer comprises a first support base, a first release layer, and a first aluminized layer.

3. The method of claim 2 wherein said first support base comprises a member of the group: polyester, polyethylene, and combinations thereof.

4. The method of claim 1 wherein said thermal print layer comprises Butvar.

5. The method of claim 1 wherein said thermal print layer comprises a polyacrylate.

6. The method of claim 1 wherein the laminating temperature is about 120° C. for dye based image.

7. The method of claim 1 wherein the laminating temperature is less than about 120° C. for pigment based images.

8. The method of claim 1 wherein the laminating pressure is performed at up to 80 psi.

9. The method of claim 1 wherein the image is an inkjet generated image.

10. The method of claim 1 wherein said imaged receiver sheet comprises a monochrome image.

11. The method of claim 1 wherein said imaged receiver sheet comprises a multicolor image.

12. The method of claim 1 wherein said second support layer is a flexible clear material.

13. The method of claim 1 wherein said thermal print layers each has a thickness of between 1 and 75 microns.

14. The method of claim 1 wherein said imaged receiver sheet has a resolution of between about 1000 and about 4000 dpi.

15. The method of claim 1 wherein said imaged receiver sheet has a resolution of between about 1800 and 3000 dpi.

* * * * *